United States Patent
de Jongh et al.

(10) Patent No.: US 8,542,078 B2
(45) Date of Patent: Sep. 24, 2013

(54) DYNAMIC IMPEDANCE MATCHING NETWORK AND METHOD FOR MATCHING AN IMPEDANCE BETWEEN A SOURCE AND A LOAD

(75) Inventors: Maurice de Jongh, Nijmegen (NL); Adrianus van Bezooijen, Molenhoek (NL)

(73) Assignee: EPCOS AG, Munich (DE)

( * ) Notice: Subject to any disclaimer, the term of this patent is extended or adjusted under 35 U.S.C. 154(b) by 335 days.

(21) Appl. No.: 13/016,707

(22) Filed: Jan. 28, 2011

(65) Prior Publication Data

US 2011/0163935 A1 Jul. 7, 2011

Related U.S. Application Data

(63) Continuation of application No. PCT/EP2009/059754, filed on Jul. 28, 2009.

(30) Foreign Application Priority Data

Aug. 7, 2008 (EP) .................................... 08162029

(51) Int. Cl.
*H03H 7/38* (2006.01)
(52) U.S. Cl.
USPC ............................................................ 333/32
(58) Field of Classification Search
USPC ................................................. 333/17.3, 32
See application file for complete search history.

(56) References Cited

U.S. PATENT DOCUMENTS

| 2,745,067 | A | | 5/1956 | True et al. |
|---|---|---|---|---|
| 3,443,231 | A | | 5/1969 | Roza |
| 3,906,405 | A | | 9/1975 | Kommrusch |
| 4,112,395 | A | | 9/1978 | Seward |
| 5,483,680 | A | * | 1/1996 | Talbot ............................ 455/107 |
| 6,845,126 | B2 | | 1/2005 | Dent et al. |
| 7,307,494 | B2 | * | 12/2007 | Erb ................................ 333/126 |
| 2004/0100341 | A1 | | 5/2004 | Luetzelschwab et al. |
| 2005/0007291 | A1 | | 1/2005 | Fabrega-Sanchez et al. |
| 2008/0258836 | A1 | * | 10/2008 | Kim et al. ...................... 333/17.3 |

FOREIGN PATENT DOCUMENTS

| CA | 1301914 | 5/1992 |
|---|---|---|
| DE | 36 44 477 A1 | 7/1988 |
| EP | 0 005 592 A1 | 11/1979 |
| GB | 1 510 755 | 5/1978 |
| WO | WO 02/063782 A2 | 8/2002 |
| WO | WO 2006/054245 A1 | 5/2006 |
| WO | WO 2006/054246 A1 | 5/2006 |

OTHER PUBLICATIONS

Thompson, M., et al., "PI-Network Design Software," International Conference on Electronics, Circuits and Systems, 1996, pp. 1-4, IEEE.

(Continued)

*Primary Examiner* — Stephen Jones
(74) *Attorney, Agent, or Firm* — Slater & Matsil, L.L.P.

(57) ABSTRACT

An impedance matching network includes an impedance matching circuit for dynamically matching an impedance between a source and a load. Matching is done by varying the real part and the imaginary part of the impedance of the impedance matching circuit independently.

18 Claims, 5 Drawing Sheets

(56) References Cited

OTHER PUBLICATIONS

Thompson, M., et al., "Fast Antenna Tuning Using Transputer Based Simulated Annealing," Electronics Letters, Mar. 30, 2000, pp. 603-304, vol. 36, No. 7, IEEE.

Thompson, M., et al., "Application of Multi Objective Evolutionary Algorithms to Analogue Filter Tuning," Proceedings on First International Conference on Evolutionary Multi-Criterion Optimization, 2001, 14 pages, vol. 1993, Spring, Berlin.

Thompson, M., et al., "Application of the Genetic Algorithm and Simulated Annealing to LC Filter Tuning," Proc. Circuit Devices, Aug. 2001, pp. 177-182, vol. 148, No. 4, IEEE.

\* cited by examiner

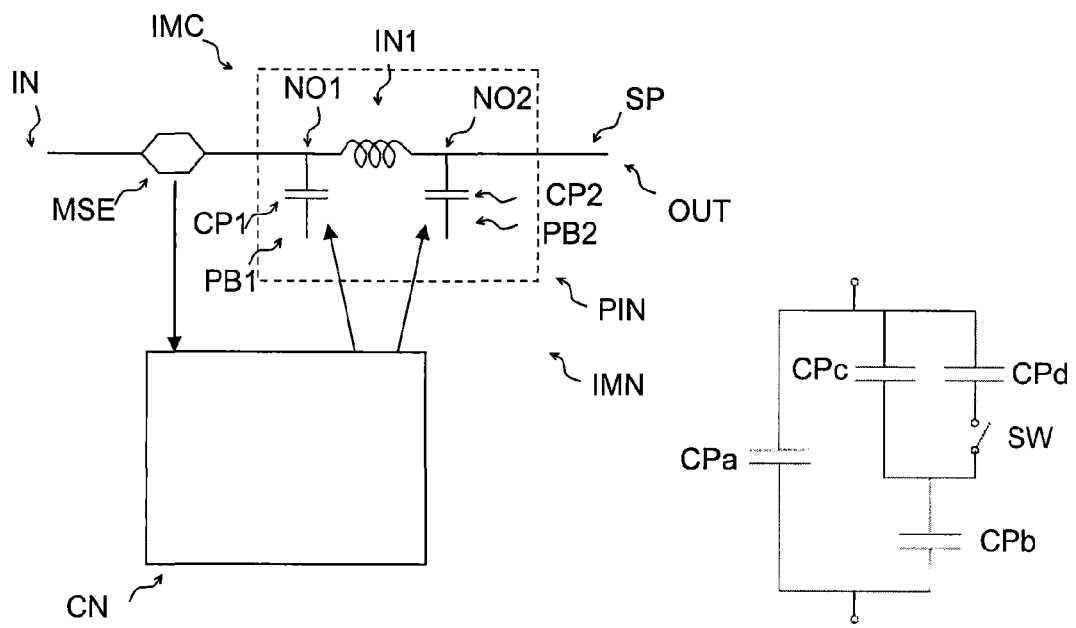
Fig. 2
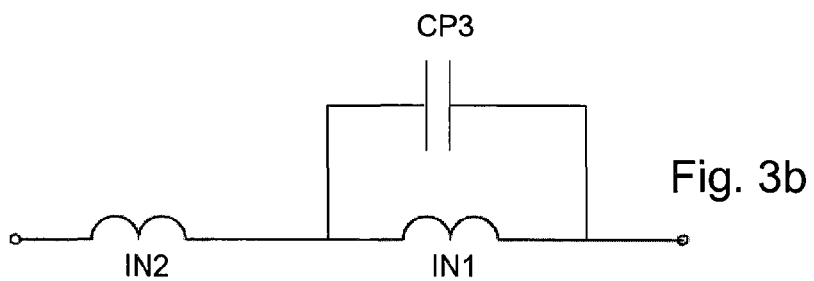
Fig. 3a
Fig. 3b
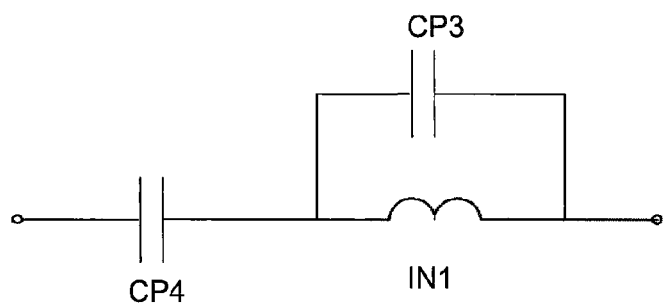
Fig. 3c

US 8,542,078 B2

DYNAMIC IMPEDANCE MATCHING NETWORK AND METHOD FOR MATCHING AN IMPEDANCE BETWEEN A SOURCE AND A LOAD

This application is a continuation of co-pending International Application No. PCT/EP2009/059754, filed Jul. 28, 2009, which designated the United States and was published in English, and which claims priority to European Application No. 08162029.6, filed Aug. 7, 2008, both of which applications are incorporated herein by reference.

TECHNICAL FIELD

The present invention relates to a dynamic impedance matching network matching the impedance of an antenna as a load impedance to internal circuits as source impedances such as those used in portable communication devices, for example in mobile phones.

BACKGROUND

U.S. Pat. No. 6,845,126 B2 relates to a system for an adaptive antenna impedance matching. The impedance mismatch is determined dynamically by measuring the strength of a signal reflected from an antenna. An impedance matching circuit being electrically connected within the signal path is tuned in order to minimize the Voltage Standing Wave Ratio (VSWR). Tuning can be done by varying the reactances of different reactance-elements being electrically connected within the impedance matching circuit.

FIG. 1a shows a simple embodiment of a well known pi-section impedance matching circuit. A source impedance S is electrically connected in series with a signal path SP. An inductance element IN1 is electrically connected in series within the signal path SP, a capacitance element CP1 connects a contact of the inductance element with ground and another capacitance element CP2 connects the other side of the inductance element with ground. The three reactance elements CP1, CP2 and IN1 form the pi-section and are adjustable independently.

FIG. 1b presents a Smith-diagram showing the impedance of the above mentioned matching circuit. The desired value, e.g., 50 Ohms, is at the center of the diagram containing groups of curves exemplarily representing the total impedance depending on the value of the reactances of all three reactance elements. Variation of only one reactance limits the impedance to a circle-like subset of the whole area of the Smith-diagram.

Thus, it is obvious that dynamically finding a correct setting for all three elements that satisfies a given specification concerning the desired total impedance is not trivial. Algorithms to find the best setting are therefore not straightforward but may base on lookup-tables and are complex and prone to errors.

Therefore, what is needed is an impedance matching network with improved design to work with a straightforward and unambiguous algorithm.

SUMMARY OF THE INVENTION

The present invention provides an impedance matching network that include a signal path comprising in input and an output. An impedance matching circuit electrically is connected within the signal path and comprises a first tunable reactance element and a second tunable reactance element. A mismatch sensing element is embedded in the signal path. A control-network is designed to identify the mismatch of the signal propagating in the signal path by use of the mismatch sensing element and to tune the tunable reactance elements dependent on the identified mismatch. The tunable reactance elements are selected such that tuning one of the reactance elements mainly varies the real component of the impedance of the impedance matching circuit and tuning the other of the reactance elements mainly varies the imaginary component of the impedance matching circuit.

In a preferred embodiment, a pi-section network being composed of a serial connected inductance L and two parallel connected capacitances $C_1$ and $C_2$ is used as impedance matching circuit. Such a circuit corresponds to a low pass filter.

Accordingly the impedance matching circuit can also be realized by a high pass filter being based on pi- or T- or more general on "pi-like" circuits. In this case inductance elements and reactants elements are interchanged. In the following sections for simplicities sake only low pass circuits are considered. But for someone skilled in the art it is clear the basic ideas are valid for both: for high pass circuit configurations and analogly for low pass circuit configurations.

For a real source impedance $R_s$ and according to Fidler and Thompson ("Application of the generic algorithm and simulated annealing to LC filter tuning", IEEE Proc. Circuits Devices Syst., vol. 148, no. 4, pp. 177-182, August 2001) the real part of the matched impedance of such a pi-section network can be expressed as $$R_M = \frac{R_S}{(1-\omega^2 LC_2)^2 + (\omega C_1 R_S + \omega C_2 R_S - \omega^3 LC_1 C_2 R_S)^2}$$

and the imaginary part can be expressed as $$X_M = \frac{\omega^3 LC_1^2 R_S^2 + 2\omega^3 LC_1 C_2 R_S^2 + \omega L - \omega C_1 R_S^2 - \omega C_2 R_S^2 - \omega^3 L^2 C_2 - \omega^5 L^2 C_1^2 C_2 R_S^2}{(1-\omega^2 LC_2)^2 + (\omega C_1 R_S + \omega C_2 R_S - \omega^3 LC_1 C_2 R_S)^2},$$

where $\omega$ is the angular frequency of the electromagnetic signal. As a result of keeping two reactances constant and varying the third a circular impedance curve is found. The impedance is bound to a circle within the complex plane with positive real part while the center and the radius of this circle are functions of the other two values.

An advantageously simple and straightforward algorithm to match a desired impedance is obtained by designing the reactance elements so, that i) the circle contains the desired impedance value, ii) the difference of the imaginary part of the center of the circle and the desired impedance value is essentially zero, iii) the difference of the real part of the center of the circle and the desired impedance value is large enough to provide an area of adequate size where the arc of the circle is mainly orthogonal to a line containing the desired value and being parallel to the axis of the real part.

The advantage of elements designed like that is that controlling the impedance of the matching circuit in an orthogonal way is now possible.

This ensures that first an optimal impedance exists and second the variation of the reactances to reach the desired impedance is directly given by the difference of an actual impedance that may depend on external circumstances and the desired impedance. The real part and the imaginary part of this difference can be minimized independently because varying the real part does not result in varying the imaginary part and vice versa.

For example: For $C_1$ and $C_2$ held constant the impedance for varying L is given by the following equation (equation 1)

$$\left[R_M - \frac{1+\omega^2 C_1^2 R_S^2}{2\omega^2 C_2^2 R_S}\right]^2 + \left[X_M - \frac{1}{\omega C_2}\right]^2 = \left[\frac{1+\omega^2 C_1^2 R_S^2}{2\omega^2 C_2^2 R_S}\right]^2.$$

Thus the impedance lies on a circle with a center at $$\left[\frac{1+\omega^2 C_1^2 R_S^2}{2\omega^2 C_2^2 R_S}, \frac{1}{\omega C_2}\right]$$

and a radius of $$\frac{1+\omega^2 C_1^2 R_S^2}{2\omega^2 C_2^2 R_S}.$$

Thus, center and radius of the circle are determined by the two capacitances $C_1$ and $C_2$.

Here, linearly varying the radius of the circle changes linearly the real part of the impedance while varying the position on the circle changes the imaginary part of the impedance.

Variation of the radius of the center position or real part of the impedance (which are equal in this case) while keeping the imaginary part of the center position constant needs to keep $C_2$ constant in the above mentioned equation. Otherwise the imaginary part of the center position (i.e., the ordinate) would change. Thus varying $C_1$ leads to a change only of the real part of impedance.

In one embodiment the matching circuit can comprise several tunable reactance elements in several pi- or pi-like sections.

In general, if there are a number of m tunable reactance elements then a number of i>=1 of a first set of tunable reactance elements are tuned differentially and a number of j>=1 of a second set of tunable reactance are tuned differentially where i+j=m and m>2. Here "tuning differentially" means that there is one degree of freedom to vary the reactance of a first tunable element while the variation of every other element of the same set is a function of the variation of the reactance of said first element.

The matching circuit may further comprise T-sections. These may form further pi-sections with existing pi-sections and hence the above mentioned basic relations are valid too and can be applied accordingly. Therefore, further T-sections can be handled like pi-sections and when "pi-sections" are mentioned it is also applicable to further T-sections.

For dynamically matching a source impedance to a load impedance the invention comprises a control loop. A matching sensor element determines the actual mismatch of the impedance matching network. A control network is electrically connected to the matching sensor element and determines the best suited values for the reactance elements according to the above mentioned method.

In a preferred embodiment the matching sensor element comprises an inductance element that is embedded in the signal path. By sensing the nodal voltage across and the current through the inductance element all information is obtained necessary to determine impedance, admittance or the reflection coefficient of the impedance matching network. This is done by a generic quadrature detector. In principle detecting the mismatch can be performed based on any reactance elements. Thus a capacitance element can also be used.

In another preferred embodiment, each of at least one serial branch of a pi-like section comprises two inductance elements that are electrically connected in series within the serial branch. The pi-like section further comprises one capacitance element (with capacitance $C_P$) that is connected in parallel to one (with inductance $L_P$) of the two serially connected inductance elements (with inductances $L_S$ and $L_P$). Equation 2:

$$\omega_{LB} L_S + \frac{1}{\frac{1}{\omega_{LB} L_P} - \omega_{LB} C_P} = \omega_{HB} L_S + \frac{1}{\frac{1}{\omega_{HB} L_P} - \omega_{HB} C_P} = X$$

refers to the imaginary part of the impedance of such a serial branch of a pi-section (see FIG. 3a). If the reactances $C_P$, $L_P$ and $L_S$ are properly chosen then two distinct frequencies $\omega_{LB}$ and $\omega_{HB}$ are solutions of this equation. This means that the pi-section has the same impedance at two different frequencies and thus a impedance matching network containing such pi-sections is capable of working in two frequency bands. Here $\omega_{LB}$ is the angular frequency of the lower band and $\omega_{HB}$ is the angular frequency of the higher band. Thus good matching can be obtained at two different frequency bands without further caring about which band is used at the moment.

An analog dual band network is achieved when each serial path of the pi-like sections contains a capacitance element electrically connected in series to the inductance element and a capacitance being electrically connected in parallel to the inductance element.

Another preferred embodiment comprises protection elements that electrically connect the input or the out of the signal path to ground. Those protection elements are arranged in protection branches and may be inductance elements.

In a preferred embodiment the matching sensing element comprises an inductive element that is electrically connected within the signal path.

In an embodiment the matching circuit is electrically connected to an antenna. Matching is necessary because the antenna may be used in different environments or may be in contact with other reactances. It may also be possible that the antenna is the antenna of a mobile communication unit and therefore changes its position and orientation. Tuning the tunable reactance elements of the impedance matching circuit according to the invention can perfectly compensate those variations.

A method for matching an impedance between a source and a load according to a defined specification includes providing a signal path. The signal path is connected an impedance matching circuit comprising at least two tunable reactance elements, each assigned to a first or a second group. A mismatch sensing element is connected to the signal path. The impedance mismatch is detected between source and load. A new set of impedance values of the tunable reactance elements id determined dependent on the mismatch and the tunable reactance elements is tuned according to the mismatch. Differentially tuning the first group of the tunable reactance elements mainly varies the real component of the impedance of the impedance matching circuit and differentially tuning the second group of the tunable reactance elements mainly varies the imaginary component of the impedance matching circuit.

In a preferred embodiment of the above mentioned method the number of tunable reactance elements is m where m is an integer number greater than two.

BRIEF DESCRIPTION OF THE DRAWINGS

The present invention will become fully understood from the detailed description given herein below and the accompanying drawings. In the drawings

FIG. 1b illustrates a smith-diagram of the network of FIG. 1a;

FIG. 2 illustrates the basic concept of the invention;

FIG. 3a illustrates a network comprising a switchable capacitance element;

FIG. 3b illustrates a dual-band serial section of a pi-section network;

FIG. 3c illustrates another dual-band serial section of a pi-section network;

FIG. 4b illustrates a smith-diagram of the impedance of the pi-section network of FIG. 4a;

FIG. 5b illustrates the impedance of the network of FIG. 5a;

The following reference symbols can be used in conjunction with the drawings.

CP1, CP2, CP3, CP5, CP6, CP7: parallel capacitance element
CP4: serial capacitance element
CPa, CPb, CPc, CPd: capacitance element
CN: control network
HPCE: capacitive element
HPIE: inductive element
IMC: inductance matching circuit
IMN: impedance matching network
IN: input of the signal path
IN1, IN2, IN3, IN4, IN5: serial inductance element
MSE: Matching sensing element
NO1, NO2: node
OUT: output of the signal path
PB1, PB2: parallel branch
S: source
SP: signal path
SW: Switch

DETAILED DESCRIPTION OF ILLUSTRATIVE EMBODIMENTS

Figure 1A:
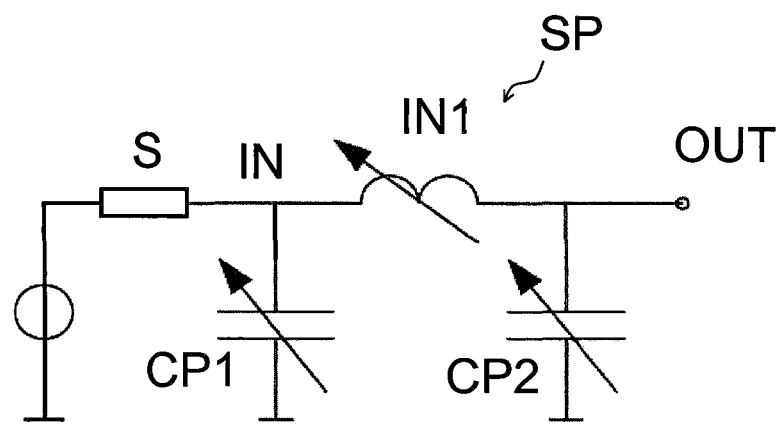
FIG. 1a illustrates a pi-section network with three adjustable reactance elements.

FIG. 1a illustrates a conventional pi-section network that may be used to match the impedance of a source S that is electrically connected to the input IN of the signal path SP to a device (e.g. an antenna) that may be connected to the output OUT of the signal path SP. In this case the signal path is represented by the tunable inductance element IN1. A capacitance element CP1 electrically connects the input of the signal path IN to ground while another capacitance element CP2 electrically connects the output of the signal path to ground. Both capacitance elements are tunable. Thus there are three degrees of freedom to vary the total impedance of the shown impedance matching circuit leading to the above mentioned problems further discussed in view of FIG. 1b as follows.

Figure 1B:
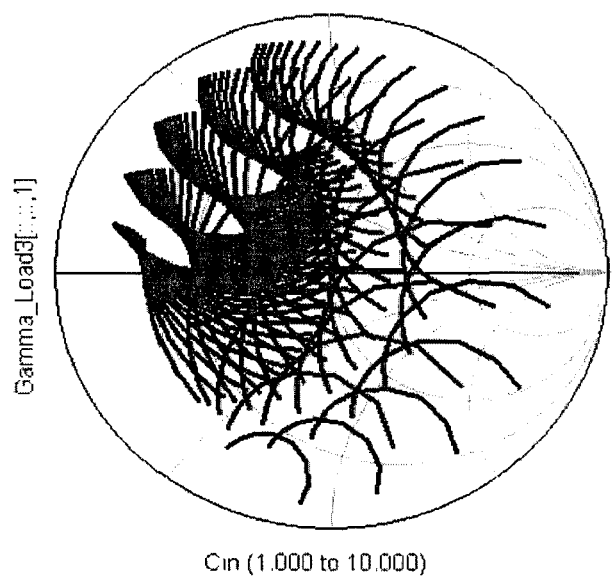

FIG. 1b illustrates the complexity of the impedance dependence of the simple pi-section shown in FIG. 1a. According to the above mentioned equation it is quite difficult to find an algorithm that enables to control 3 tunable elements independently in order to match a specified value.

FIG. 2 illustrates the basic concept of an embodiment of the invention. The signal path SP comprises a matching sensing element (MSE) that can dynamically identify the mismatch of the actual impedance. This information is sent to a control network CN that determines a new set of values for tunable elements being comprised in an impedance matching circuit IMC. This circuit comprises two sets of tunable elements (e.g., CP1 as the first set and CP2 as the other set, each set having only one member in this case). Every tunable element of each set is tuned by the control network CN differentially. This means that there is only one degree of freedom to choose the value of the reactance of one reactance element while the other values of the other tunable elements within each set are functions of the one value of the one element. Therefore two sets of tunable elements give two degrees of freedom to the control network CN to tune the impedance of the impedance matching network IMC. The arrows showing from the control network to the impedance matching circuit indicate these two degrees of freedom.

In the simplest case the impedance matching circuit comprises an inductive element IN1 electrically connected within the signal path and two capacitance elements individually electrically connecting both contacts of the inductance element IN1 to ground forming a pi-section circuit. At least two of these elements are tunable. This means that their reactance value is adjustable and can be varied by the control network CN. Especially when these reactance elements are properly designed tuning of the impedance according to the invention is remarkably straightforward and easy. As shown above the reactances of pi-like circuits can be chosen to result in an impedance behavior shown in FIG. 4b disclosing a mainly orthogonal control of the impedance in a vicinity of a specified match-impedance.

Figure 4A:
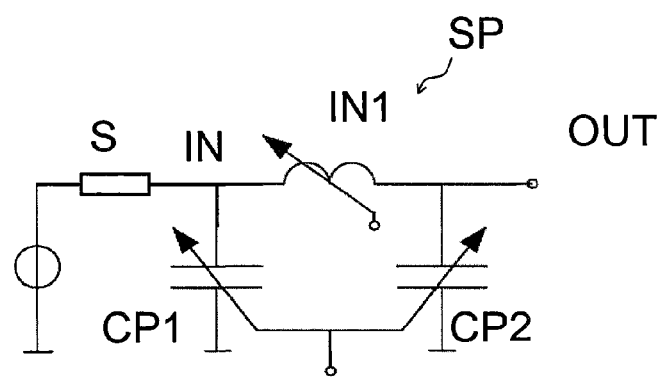
FIG. 4a illustrates a pi-section network comprising a tunable inductance element and two differentially tunable capacitance elements.
Figure 4B:
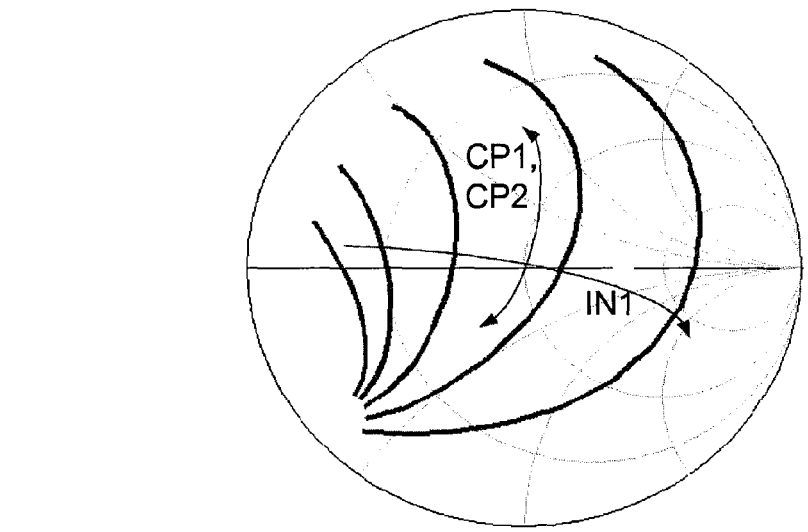

FIG. 4a illustrates one embodiment of the impedance matching circuit enabling the control network CN to tune the impedance as shown in FIG. 4b. The determining difference between FIG. 4a and FIG. 1a is based in the differential control indicated by the connected arrows of both tunable capacitance elements CP1 and CP2. Thus these two capacitance elements constitute one set of tunable elements while the tunable inductance element IN1 constitutes the other set. Referring to FIG. 4b the specified impedance to match (e.g., 50 Ohm) is positioned in the center of the smith-diagram. Varying the inductance of inductance element IN1 results in mainly varying the real part of the impedance in a vicinity of the specified impedance, while differentially varying the capacitance of the capacitance elements CP1, CP2 results in mainly varying the imaginary part of the impedance of the impedance matching circuit. The advantages of such a design are clear. It is ensured that optimal impedance matching can be achieved and matching the specified impedance can be achieved in a minimum number of steps. In principle, matching can be performed in a single step.

Figure 5A:
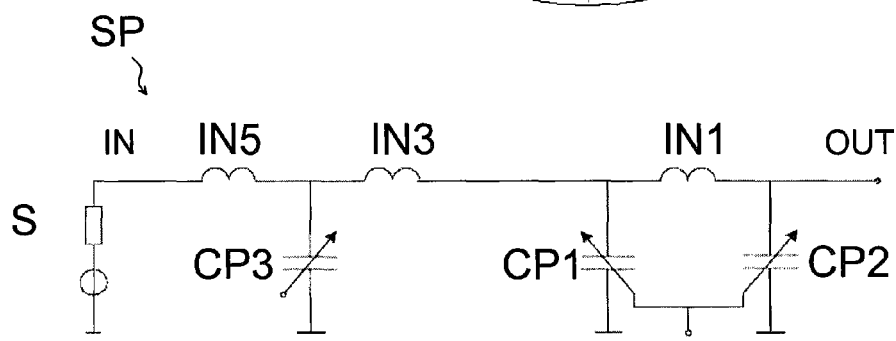
FIG. 5a illustrates an impedance matching circuit comprising a pi-section with differentially controlled capacitance elements and a T-section network.

FIG. 5a illustrates another embodiment of the impedance matching circuit IMC. Three inductive elements IN1, IN3, IN5 are electrically connected in series within the signal path SP between input IN and output OUT of the signal path. Two differentially tunable capacitance elements CP1, CP2 each electrically connecting the signal path with ground in a respective parallel branch form one set of tunable reactance elements while another tunable capacitance element CP5 connects the signal path with ground in a third parallel branch. The impedance matching circuit shown in FIG. 5a thus comprises a pi-section network being composed of the elements CP1, IN1, CP2 and a T-section-network being composed of the elements IN3, CP3, IN5. The T- and the pi-section networks are electrically connected in series within the signal path SP. This arrangement can also be regarded as a dual-pi-section network, comprising the elements CP3, IN3, CP1, IN1 and CP2 being electrically connected in series to the impedance element IN5. Therefore this and similar network topologies are referred to "pi-like" networks.

Figure 5B:
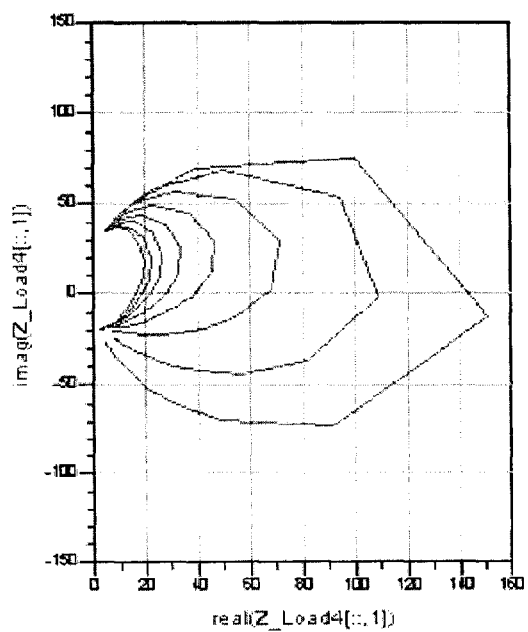

Differential control of the capacitance elements CP1 and CP2 and control of the capacitance element CP5 enables the control network CN to tune the impedance of the impedance matching network as shown in FIG. 5b. Here, a part of the complex plane represents the complex impedance of the impedance matching network according to FIG. 5a is shown. Analog to FIG. 4b, differentially varying the capacitances of CP1 and CP2 mainly varies the imaginary part of the impedance while varying the capacitance of CP3 varies the real part. Thus again an orthogonal-like tuning is possible providing the mentioned advantages.

Matching within two frequency bands can be done with further reactance elements electrically connected within the impedance matching circuit IMC. One example is shown in FIG. 3a. In order to tune the impedance matching circuit at different frequencies it may comprise further capacitance elements CPa, CPb, CPc, CPd electrically connected within the signal path. In this embodiment CPa and CPb are electrically connected in parallel and CPc and CPd are electrically connected in parallel. Further, capacitances CPc and CPd are electrically connected in series to CPb. A switch can open or close the serial connection between CPd and CPb. Activating or deactivating of CPd results in two different total capacitances of the electrical circuit comprising these four capacitances. This enables to the tune the impedance matching circuit to obtain matching at two different frequency bands.

FIG. 3b illustrates another possibility to use the impedance matching network at two different frequency bands. Two inductance elements IN1 (with inductance $L_P$), IN2 (with inductance $L_S$) are electrically connected in series while a capacitance CP3 element (with capacitance $C_P$) is electrically connected in parallel to the inductance element IN1. This network exhibits the serial sections of the pi-like circuits within the impedance matching circuit. According to equation 2, it can be assured by designing the reactances of the elements that a specified impedance is obtained at two different frequencies. The reactance elements may be tunable in order to dynamically tune the impedance according to the invention.

FIG. 3c illustrates still another embodiment of the serial sections of the pi-like networks being comprised by the impedance matching circuit. Compared to FIG. 3b the inductance element IN2 is replaced by a capacitance element CP4. This network also enables tuning to obtain a specified impedance at two different frequency bands.

Figure 3D:
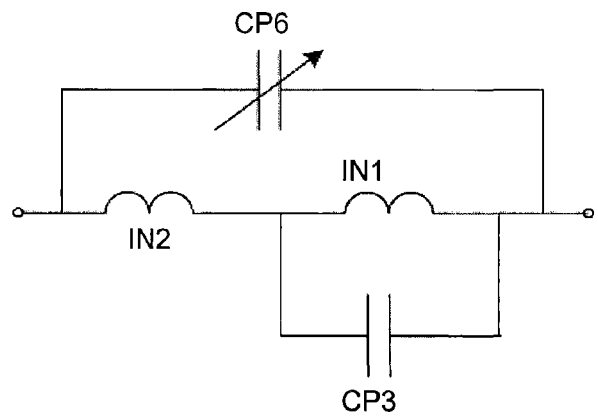
FIG. 3d illustrates still another dual-band serial section of a pi-section network comprising a tunable capacitance element.

FIG. 3d illustrates the serial section of the pi-like circuits of the impedance matching circuit according to FIG. 3b comprising a further tunable capacitance element CP6 that is electrically connected in parallel to both serial inductance elements IN1, IN2.

Figure 3E:
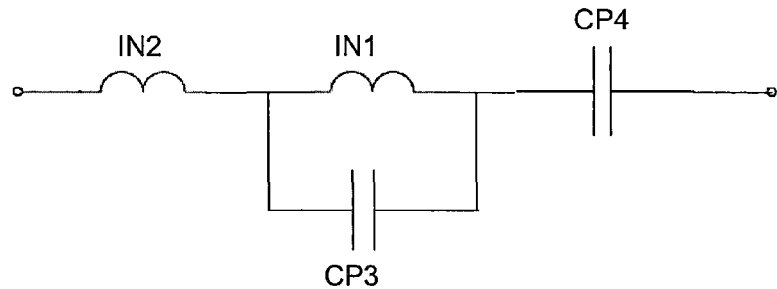
FIG. 3e illustrates another embodiment of a serial section of a pi-section network.

FIG. 3e illustrates the serial section of the pi-like circuits of the impedance matching circuit according to FIG. 3b comprising a further capacitance element CP4 that is electrically connected in series within the serial section.

Figure 3F:
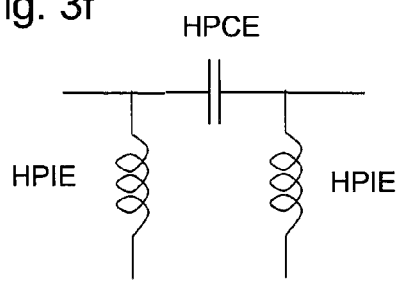
FIG. 3f illustrates a pi-section of an impedance matching network for use in a high pass circuit configuration.

FIG. 3f illustrates a pi-section of an impedance matching network for use in a high pass circuit configuration. It comprises a capacitive element HPCE in the signal path (i.e. the serial path) and two inductance elements HPIE, each being electrically connected in a parallel path. Based on such sections the present circuit matching network can be realized in a high-pass configuration known for a person skilled in the art.

Further dynamically tunable or static reactance elements can be positioned in further parallel or serial branches electrically connected to the signal line. Alternatively, combinations of the presented network sections can be comprised by the impedance matching circuit in order to improve its matching characteristics.

Figure 6:
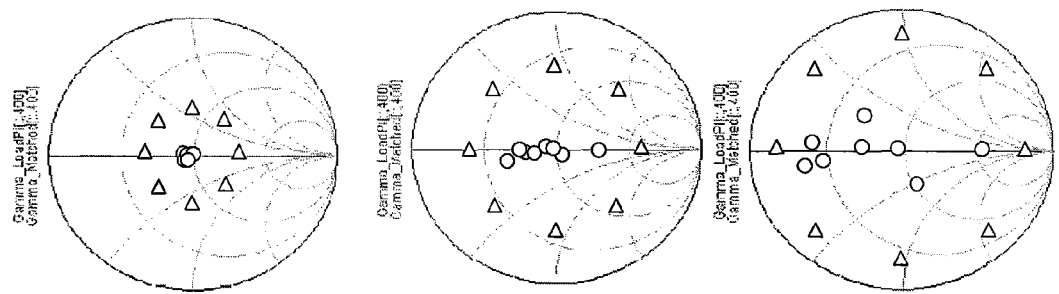
FIG. 6 illustrates simulated convergence behavior of the impedance matching network of FIG. 7.

FIG. 6 illustrates the convergence behavior of a preferred embodiment of the present invention starting with eight distinct unmatched impedances with (from left diagram to right diagram) increasing difference in absolute value between actual impedance and specified impedance. The starting impedances are located on the corners of a symmetric octagon and denoted by triangles. The matched impedances are denoted by circles. What can be seen is that if the starting impedance is within a vicinity of the specified value matching works very well (left smith-diagram). Even if the starting point is in a region where the independent control of real and imaginary part is not fully given any more (centered smith-diagram) convergence is still good. This is still valid in the right smith chart where an improvement of the impedance is unambiguously present.

Figure 7:
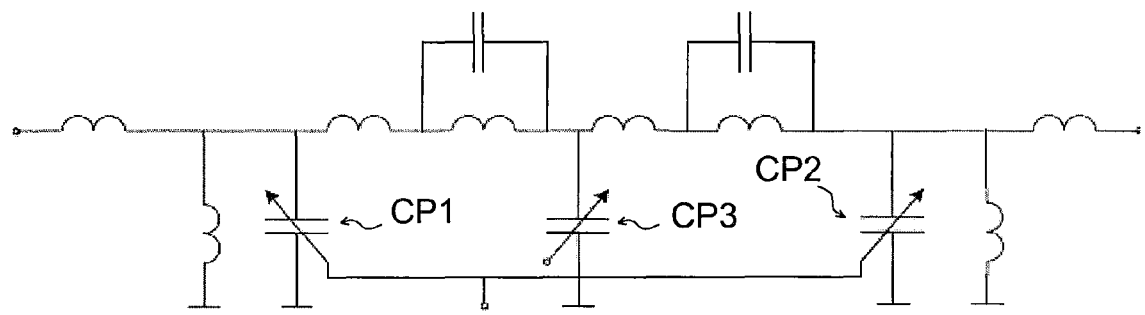
FIG. 7 illustrates a dual-band dual section impedance matching network with two pi-sections.

FIG. 7 illustrates a preferred embodiment of the impedance matching network comprising two successive arranged pi-sections being tuned by varying three capacitive elements CP1, CP2, CP3. Each capacitive element is electrically connected in it's own parallel path. Capacitive elements CP1 and CP2 are differentially controlled as indicated in the figure.

The present invention comprises tunable reactance elements. Tunable reactance elements may be tunable capacitors, especially variable MEMS-capacitors (e.g. CMOS switched capacitor arrays) or varactors. But the basic concept does not depend on details concerning the mechanism of the tunable elements which also may be formed by variable inductors. Further, the invention is not restricted by the embodiments or the accompanied figures. Especially embodiments based on high-pass circuit configurations are also possible. Thus, numerous variations departing from the figures are possible without departing from the invention.

What is claimed is:
1. An impedance matching network, comprising
a signal path comprising an input and an output;
an impedance matching circuit electrically connected within the signal path, the impedance matching circuit comprising a first tunable reactance element and a second tunable reactance element;
a mismatch sensing element embedded in the signal path; and
a control-network configured to identify a mismatch of a signal propagating in the signal path according to the mismatch sensing element and to tune the first and second tunable reactance elements dependent on the identified mismatch;

wherein the tuneable reactance elements are adapted such that tuning the first reactance elements mainly varies a real component of an impedance of the impedance matching circuit and tuning the second reactance elements mainly varies an imaginary component of the impedance matching circuit;

wherein the impedance matching network comprises an n-section-pi-like circuit that comprises a serial section between two parallel branches, where n is an integer number greater than zero, and wherein each section comprises as reactance elements an inductive element in the serial section and a capacitive element in each parallel branch; and wherein m reactance elements are tunable, wherein i reactance elements including the first tunable reactance element are tuned differentially, and wherein j reactance elements including the second tunable reactance element are tuned differentially together with the second tunable reactance element, where m, i, and j are integer numbers with $2<m\leq 2n+1$, $i+j=m$, $i\geq 1$ and $j\geq 1$.

2. The impedance matching network according to claim 1, wherein the m reactance elements comprise additional capacitive elements and additional inductive elements for each section of the n-section pi-like circuit, wherein each additional inductive element is electrically connected in series with the inductive element and each additional capacitance element is electrically connected in parallel with one of the additional inductive elements thereby forming a dual band impedance matching network.

3. The impedance matching network according to claim 1, wherein the m reactance elements comprise a first additional capacitive element and a second additional capacitive element for each section of the n-section pi-like circuit, wherein each first additional capacitive element is electrically connected in series with the inductive element and each second additional capacitance element is electrically connected in parallel with the additional inductive element thereby forming a dual band impedance matching network.

4. The impedance matching network according to claim 1, further comprising a first inductive protection element in a first protection branch electrically connected to the input of the signal path.

5. The impedance matching network according to claim 1, further comprising a second inductive protection element in a second protection branch electrically arranged in parallel to the output of the signal path.

6. The impedance matching network according to claim 1, wherein the mismatch sensing element comprises a sensing inductance element electrically connected in series in the signal path.

7. The impedance matching network according to claim 1, wherein the control-network comprises a quadrature-detector to determine the real part and the imaginary part of the detected impedance.

8. The impedance matching network according to claim 1, wherein the impedance matching network comprises a n-section-pi-like circuit that comprises a serial section between two parallel branches, wherein n is an integer number greater than zero ($n>0$) and each section comprises as reactance elements an capacitive element in the serial section and an inductive element in each parallel branch.

9. The impedance matching network according to claim 1, wherein the impedance matching network is configured to match a signal source to a signal load.

10. The impedance matching network according to claim 9, wherein the impedance matching network is configured to match in a first frequency band and in a second frequency band different from the first frequency band.

11. The impedance matching network according to claim 9, wherein the signal load comprises an antenna.

12. The impedance matching network according to claim 9 in combination with the antenna, the antenna being coupled to the output of the signal path.

13. A method for matching an impedance between a source and a load using an impedance matching circuit in a signal path between the source and the load, the impedance matching circuit comprising a plurality of tunable reactance elements, each tunable reactance element assigned to a first or a second group, the method comprising:

detecting an impedance mismatch between source and load; and tuning the tunable reactance elements according to the detected mismatch, wherein the tuning comprises differentially tuning the first group of tunable reactance elements to mainly vary a real component of an impedance of the impedance matching circuit and differentially tuning the second group of tuneable reactance elements to mainly vary the imaginary component of the impedance matching circuit.

14. The method according to claim 13, wherein the plurality of tunable reactance elements comprises m tunable reactance elements, m being an integer greater than two.

15. The method according to claim 13, wherein detecting an impedance mismatch comprises detecting an impedance mismatch between the source and the load using an mismatch sensing element that is coupled to the signal path.

16. The method according to claim 13, wherein tuning comprises determining a new set of values of impedances of the tunable reactance elements dependent on the detected mismatch.

17. The method according to claim 13, wherein the matching is done in a first frequency band and in a second frequency band that is different from the first frequency band.

18. The method according to claim 13, wherein the matching comprises matching a signal source to an antenna.

* * * * *